(12) United States Patent
Seo et al.

(10) Patent No.: US 7,759,605 B2
(45) Date of Patent: Jul. 20, 2010

(54) METHOD OF DECIDING FOCAL PLANE AND METHOD OF CRYSTALLIZATION USING THEREOF

(75) Inventors: Hyun Sik Seo, Gyeonggi-Do (KR); Yun Ho Jung, Seoul (KR); Young Joo Kim, Gyeonggi-Do (KR); JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 297 days.

(21) Appl. No.: 11/826,160

(22) Filed: Jul. 12, 2007

(65) Prior Publication Data

US 2008/0011726 A1    Jan. 17, 2008

Related U.S. Application Data

(62) Division of application No. 11/017,826, filed on Dec. 22, 2004, now Pat. No. 7,253,010.

(30) Foreign Application Priority Data

Dec. 24, 2003   (KR)   ................ 10-2003-0096871

(51) Int. Cl.
*B23K 26/04* (2006.01)
*H01L 21/428* (2006.01)
(52) U.S. Cl. ................... 219/121.65; 219/121.83; 250/201.2
(58) Field of Classification Search ........... 219/121.65, 219/121.66, 121.73, 121.83; 250/201.2
See application file for complete search history.

(56) References Cited

U.S. PATENT DOCUMENTS 4,472,055 A * 9/1984 Tsutsumi ............... 219/121.83

5,408,083 A * 4/1995 Hirukawa et al. ........ 250/201.2
5,757,015 A    5/1998 Takemoto et al.
6,075,222 A * 6/2000 Hasegawa .............. 219/121.71

(Continued)

FOREIGN PATENT DOCUMENTS

| JP | 1-256114 A | * | 10/1989 |
| JP | 10-76384 A | * | 3/1998 |
| JP | 10-296475 A | * | 11/1998 |
| JP | 11-129081 A | * | 5/1999 |
| KR | 10-0437920 B1 | | 6/2004 |
| WO | WO-2004/050290 A | * | 6/2004 |

OTHER PUBLICATIONS machine translation of Japan Patent document No. 10-76,384, Aug. 2009.*

(Continued)

*Primary Examiner*—Geoffrey S Evans
(74) *Attorney, Agent, or Firm*—Birch, Stewart, Kolasch & Birch LLP

(57) ABSTRACT

A crystallization method and system are provided which improve a crystallization process by deciding a best-fit focal plane for a laser beam using a test mask and then applying the decided best-fit focal plane to the crystallization process. The crystallization method includes loading a test mask on a mask stage; deciding a best-fit focal plane by performing a crystallization test using the test mask, checking the test result and deciding conditions of a best-fit focal plane from the test result; moving the mask stage to a position corresponding to the best-fit focal plane; loading a mask for crystallization process onto the moved mask stage; and performing the crystallization process using the mask for crystallization process.

3 Claims, 9 Drawing Sheets

U.S. PATENT DOCUMENTS

| | | | |
|---|---|---|---|
| 6,279,147 B1 * | 8/2001 | Buynoski et al. ............... | 438/16 |
| 6,635,554 B1 | 10/2003 | Im et al. | |
| 6,861,614 B1 | 3/2005 | Tanabe et al. | |
| 6,974,653 B2 | 12/2005 | Leung et al. | |
| 2002/0083557 A1 * | 7/2002 | Jung ........................ | 23/295 R |
| 2002/0179004 A1 * | 12/2002 | Jung ........................... | 117/43 |
| 2003/0153999 A1 | 8/2003 | Miyanaga et al. | |
| 2003/0183744 A1 * | 10/2003 | Nantel et al. ............. | 250/201.2 |
| 2003/0215973 A1 | 11/2003 | Yamazaki et al. | |
| 2006/0138111 A1 * | 6/2006 | Hillebrand et al. ..... | 219/121.83 |

OTHER PUBLICATIONS machine translation of Japan Patent document No. 10-296,475, Aug. 2009.*

Sameshima et al., IEEE Electron Device Letters, vol. EDL-7, No. 5, pp. 276-278 (May 1986).

Sera et al., IEEE Transactions on Electron Devices, vol. 36, No. 12, pp. 2868-2872 (Dec. 1989).

Brotherton et al., J. Appl. Phys., vol. 82, No. 8, pp. 4086-4094 (Oct. 15, 1997).

* cited by examiner

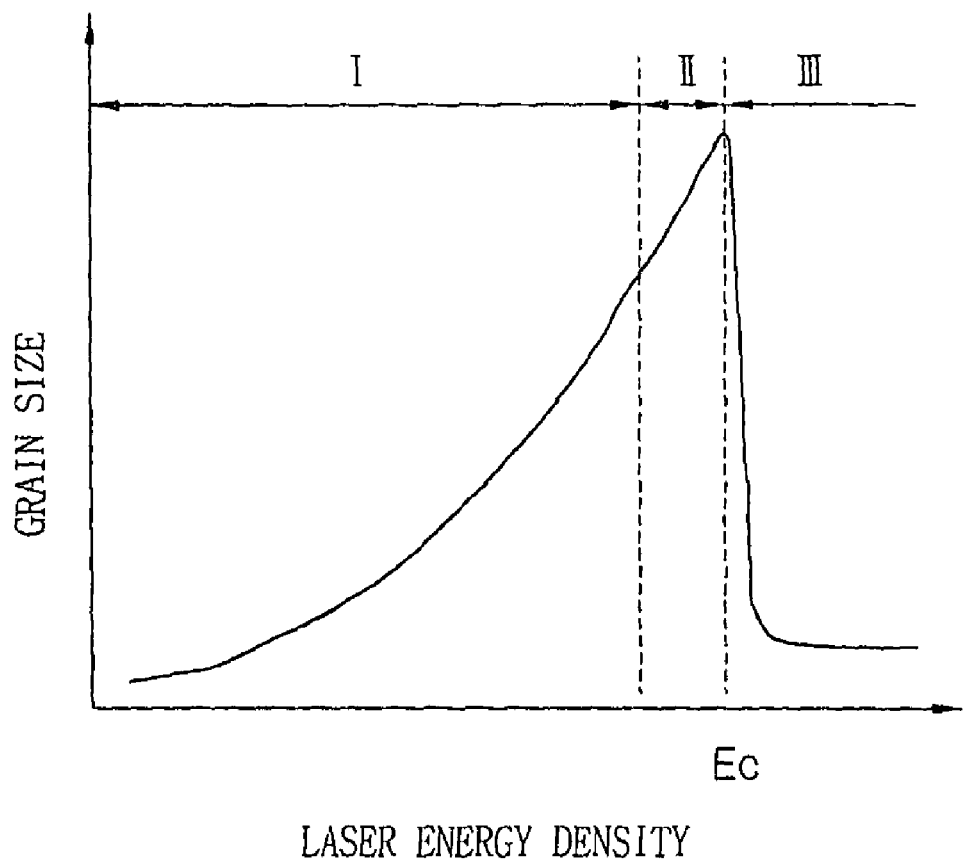

(a) DEEP FOCUS     (B) JUST FOCUS     (C) UNDER FOCUS

METHOD OF DECIDING FOCAL PLANE AND METHOD OF CRYSTALLIZATION USING THEREOF

This application is a Divisional of application Ser. No. 11/017,826, filed on Dec. 22, 2004, now U.S. Pat. No. 7,253,010, the entire contents of which are hereby incorporated by reference and for which priority is claimed under 35 U.S.C. §120. This application also claims the priority benefit of Patent Application No. 10-2003-0096871 filed on Dec. 24, 2003 in Republic of Korea, which is hereby incorporated by reference.

BACKGROUND OF THE INVENTION

1. Field of the Invention

The present invention relates to a method of crystallization, and more particularly, to a method and system for deciding a focal plane and a method and system for crystallization using the focal plane deciding method, which improve the crystallization process by deciding a best-fit focal plane using a test mask and then applying the decided best fitted focal plane to the crystallization.

2. Discussion of the Related Art

Recently, as the interest in an information display has been increased and there is a continually increasing demand for portable information media, researches on thin film type Flat Panel Display (FPD) devices, which are replacing Cathode Ray Tubes (CRTs), and its commercialization have been made preponderantly. In particular, a Liquid Crystal Display (LCD) device among such flat panel display devices displays images using an optical anisotropy of liquid crystal. The LCD device has been actively applied to notebook computers, desktop monitors, or the like because it has an excellence in resolution, color rendering capability and picture quality.

An Active Matrix (AM) driving method, a driving method mainly used in the LCD device, drives the liquid crystal of a pixel region using an amorphous silicon Thin Film Transistor (TFT) as a switching device.

In 1979, English LeComber established conception of amorphous silicon thin film transistor technology. In 1986, it was put to practical use as a three-inch liquid crystal portable television. Lately, a TFT-LCD device with a large display area of more than 50 inches has been developed.

However, with the field effect mobility (<1 cm2/Vsec) of the amorphous silicon thin film transistor, there is a limit when the amorphous silicon thin film transistor is used in peripheral circuits that require high-speed movement of more than 1 MHz. Accordingly, researches for simultaneously integrating a pixel region and a driving circuit region on a glass substrate using a polycrystalline silicon thin film transistor of which field effect mobility is greater than that of the amorphous silicon thin film transistor have been actively pursued.

The polycrystalline silicon thin film transistor technology has been applied to small modules such as a camcorder or the like since an LCD color television was developed in 1982. Since it has low photosensitivity and high field effect mobility, it can be directly fabricated on a substrate to form driving circuits.

Increased mobility can increase the operation frequency of the driving circuit unit for determining the number of driving pixels, which facilitates fixing of the display device. Also, the picture quality could increase since the distortion of the transfer signal is decreased because of the reduction in the charging time of a signal voltage of the pixel unit.

In addition, since the polycrystalline silicon thin film transistor can be driven at less than 10V in comparison with the amorphous silicon thin film transistor having a high driving voltage (~25V), it has an advantage that the power consumption can be reduced.

Meanwhile, the polycrystalline thin film transistor can be mainly fabricated by directly depositing a polycrystalline silicon thin film on a substrate and by depositing an amorphous silicon thin film that is then crystallized by a thermal process. In particular, to use a cheap glass as a substrate, low temperature processes are required, and, to use the polycrystalline silicon thin film for a driving circuit unit, a method for increasing the field effect mobility of the thin film transistor is required.

Thermal processing methods for crystallizing an amorphous silicon thin film are the Solid Phase Crystallization (SPC) method and the Excimer Laser Annealing (ELA) method, mainly.

The solid phase crystallization method forms a polycrystalline silicon thin film at a temperature of approximately 600° C. In this method, a polycrystalline silicon thin film is crystallized by forming an amorphous silicon thin film on a glass substrate and then by performing a heating process at approximately 600° C. for up to a few hours or tens of hours. A polycrystalline silicon thin film obtained by the solid phase crystallization has comparatively large-size grains of about several μm. However, there are many defects in the grains. Although not as bad as grain boundaries in a thin film transistor, it is known that these defects affect negatively on the performance of the thin film transistor.

The excimer laser annealing method is an essential method of fabricating a polycrystalline silicon thin film at a low temperature. The amorphous silicon thin film is crystallized by momentarily irradiating a high energy laser beam onto the amorphous silicon thin film for tens of nanoseconds. The amorphous silicon is melted and crystallized in a very short time, so that the glass substrate is not damaged.

In addition, a polycrystalline silicon thin film fabricated using the excimer laser has excellent electrical characteristics, compared to a polycrystalline silicon thin film fabricated by a general thermal processing method. For example, a field effect mobility of a polycrystalline silicon thin film transistor fabricated by the excimer laser annealing method is more than 100 cm2/Vsec, whereas a field effect mobility of an amorphous silicon thin film transistor is generally 0.1 to 0.2 cm2/Vsec and a field effect mobility of a polycrystalline silicon thin film transistor fabricated by a general thermal processing method is 10 to 20 cm2/Vsec (IEEE Trans. Electron Devices, vol. 36, no. 12, p. 2868, 1989).

Hereinafter, a crystallization method using a laser according to a related art will be described in detail.

FIG. 1 is a graph illustrating a grain size of a polycrystalline silicon thin film with respect to an energy density of a laser to be irradiated.

As shown in FIG. 1, in the first and second regions (I) and (II), as the energy density increases, the grain size of the polycrystalline silicon thin film increases (IEEE Electron Dev. Lett., DEL-7, 276, 1986). However, in the third region (III), when the laser having an energy density higher than a specific energy density Ec is irradiated, the grain size of the polycrystalline silicon thin film decreases drastically. That is, the crystallization mechanism for the silicon thin film becomes different according to the energy densities of the laser to be irradiated.

FIGS. 2A to 2C, 3A to 3C and 4A to 4C are sectional views illustrating silicon crystallization mechanisms according to the laser energy densities of the graph shown in FIG. 1. They illustrate sequential crystallization processes according to each laser energy density.

A crystallization mechanism of amorphous silicon by a laser annealing is influenced by various factors such as laser irradiation conditions including laser energy density, irradiation pressure, substrate temperature, and physical/geometrical characteristics including absorption coefficient, thermal conductivity, mass, impurity containing degree and thickness.

First, as shown in FIGS. 2A to 2C illustrating the crystallization process for the first region (I) of the graph in FIG. 1, since the first region (I) of the graph in FIG. 1 is a partial melting region, an amorphous silicon thin film 12 is crystallized only up to the dotted line and a size of a grain 30 formed at this time is about hundreds A.

When a laser having the energy density in the first region (I) is irradiated on the amorphous silicon thin film 12 on a substrate 10 where a buffer layer 11 is formed, the amorphous silicon thin film 12 is melted. At this time, because strong laser energy is irradiated at a surface of the amorphous silicon thin film 12, which is directly exposed to the laser beam, and relatively weak laser energy is irradiated at a lower portion of the amorphous silicon thin film 12, a certain portion of the amorphous silicon thin film 12 is melted to form a melted portion 12'. As a result, crystallization is partially performed.

Typically, in the crystallization method, crystal grows through the processes of primary melting in which a surface layer of an amorphous silicon thin film is melted by a laser irradiation, and secondary melting in which a lower portion of the amorphous silicon thin film is melted by the latent heat generated during the solidification of the melted silicon and the solidification of the lower layer. These crystal growth processes will be explained in more detail.

An amorphous silicon thin film on which a laser beam is irradiated has a melting temperature of more than 1000° C. and is primarily melted into a liquid state. Because there occurs a great temperature difference between the primarily melted layer and the lower silicon and substrate, the primarily melted layer cools fast until solid phase nucleation and solidification are generated. The melted layer by the laser irradiation is maintained until the solid phase nucleation and solidification take place. Such a melting state lasts in a range that ablation does not occur for a long time when the laser energy density is high or thermal emission to the outside is low. In addition, because the primarily melted layer melts at a temperature of 1000° C. lower than the melting temperature of 1400° C. for crystalline silicon, the melted layer cools and maintains a super-cooled state where the temperature is lower than the phase transition temperature. The greater the supercooling state is (that is, the lower the melting temperature of the thin film or the faster the cooling is), the greater the nucleation rate is at the time of the solidification such that fine crystals grow during the solidification.

When the solidification starts as the primarily melted layer cools, crystals grow in an upward direction from a crystal nucleus. At this time, latent heat is emitted by the phase transition of the primarily melted layer from the liquid state to the solid state, and thus the secondarily melting begins where the lower amorphous silicon thin film of solid state melts. Such processes are repeated through the solidification whereby the crystals grow. At this time, the nucleus generation rate of the lower secondarily melted layer increases, because the lower amorphous silicon thin film is more supercooled than the primarily melted layer. Thus, the crystal size resulting from the secondarily melted layer is smaller.

Accordingly, in crystallization by a laser annealing, the cooling speed of the solidification has to be reduced to improve the crystalline characteristics. Cooling speed can be reduced by restraining absorbed laser energy from being emitted to the outside by using the restraining methods such as heating the substrate, a double beam irradiation, or inserting a buffer insulating layer.

FIGS. 3A to 3C are sectional views sequentially illustrating the silicon crystallization mechanism for the second region (II) of the graph in FIG. 1, in which the second region (II) represents a near-complete melting region.

As show in FIGS. 3A to 3C, a polycrystalline silicon thin film has relatively large grains 30A to 30C of about 3000 to 4000 Å formed down to the interface of the lower buffer layer 11.

Namely, when a nearly complete melting energy, not a complete melting energy, is irradiated on the amorphous silicon thin film 12, almost all of the amorphous silicon thin film 12 down close to the buffer layer 11 melts. At this time, there exist solid seeds 35 that have not been melted at the interface between the melted silicon thin film 12' and the buffer layer 11 (FIG. 3A). The solid seeds 35 work as a crystallization nucleus to induce side growth, thereby forming the relatively large grains 30A to 30C (J. Appl. Phys. 82, 4086).

However, since such crystallization method is possible only if the laser energy is irradiated such that the solid seeds 35 that are not melted remain on the interface with the buffer layer 11, the process window is very narrow. In addition, because the solid seeds 35 are generated non-uniformly, the crystallized grains 30A to 30C of the polycrystalline silicon thin film have different crystalline directions, that is, they have non-uniform crystallization characteristics.

Finally, FIGS. 4A to 4C are sectional views illustrating the crystallization mechanism of the third region (III) of the graph in FIG. 1 corresponding to a complete melting region.

As shown therein, very small grains 30 are irregularly formed with an energy density corresponding to the third region (III).

That is, when the laser energy density becomes higher than a specific energy density Ec, sufficient energy is applied enough to completely melt the amorphous silicon thin film 12, leaving no solid seeds that may be grown to grains. Thereafter, the silicon thin film 12' which has been melted upon receiving the strong energy laser undergoes a rapid cooling process, which generates a plurality of uniform nuclei 135 and thus fine grains 30.

Crystallization in that range has an advantage that the process window is large, but has a disadvantage that the grains 30 of the crystallized silicon thin film are fine.

Meanwhile, since a polycrystalline silicon thin film having different crystallization characteristics according to the energy density of the laser to be irradiated is formed, in order to obtain a crystalline silicon thin film having desired characteristics, it is important to control a laser such that the laser to be irradiated on a substrate has a best-fit focal plane.

FIG. 5 is an exemplary view illustrating a variety of focal planes of the laser beam. As shown therein, (A), (B) and (C) indicate a deep focus, a just focus and an under focus, respectively, in which the focal planes are formed at a lower portion layer, a surface and the outside of a substrate 210, respectively.

At this time, in case that the crystallization is performed by the just focus (B) in which the focal plane of a laser beam 260 through a lens 265 is formed on a surface of the substrate 210 on a stage 240, a crystallized thin film having the clearest crystallization shape can be obtained, whereas in case of the deep focus (A) and the under focus (C), a thin film having a clear crystallization shape cannot be obtained.

That is, in the laser crystallization, forming of a clear crystallization shape means that laser energy is made incident enough to melt an amorphous silicon thin film. In order to perform optimum crystallization processes, it is very important for a focal plane state of the laser beam to be irradiated to make the above mentioned just focus.

However, up to now, the crystallization is performed without taking a focal plane of a laser beam into account, crystallization characteristics of the crystallized silicon thin film are observed, and laser equipment and optical system are compensated, before carrying out the crystallization processes. As a result, there have been problems in that the time for the crystallization processes and the cost increase.

In addition, the above mentioned problems happen when a new mask for crystallization process is loaded onto a mask stage and when the laser equipment and optical systems are re-set.

SUMMARY OF THE INVENTION

Accordingly, the present invention is directed to a method of deciding a focal plane and a crystallization method using thereof that substantially obviate one or more of the problems due to limitations and disadvantages of the related art.

An advantage of the present invention is to provide a method of deciding a focal plane which reduces the crystallization time and the cost by improving a crystallization process and a crystallization method using thereof.

Still another advantage of the present invention is to provide a method of deciding a focal plane which makes equipment such as a computer automatically decide such a best-fit focal plane.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described a method of deciding a focal plane according to an aspect of the present invention includes loading a test mask onto a mask stage; performing a crystallization test using the test mask; checking the test result; and deciding conditions of a best-fit focal plane from the test result.

In another aspect of the present invention, a crystallization method includes loading a test mask onto a mask stage; deciding a focal plane by including the steps of performing a crystallization test using the test mask, checking the test result and deciding best-fit focal plane conditions from the test result; moving the mask stage to a position where the best-fit focal plane is formed; loading a mask for crystallization process onto the mask stage; and performing the crystallization using the mask for crystallization process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a graph illustrating a grain size of a polycrystalline silicon thin film with respect to an energy density of a laser to be irradiated;

DETAILED DESCRIPTION OF THE PREFERRED EMBODIMENTS

Reference will now be made in detail to the preferred embodiments of the present invention, examples of which are illustrated in the accompanying drawings.

A method of deciding a focal plane of the present invention and a method of crystallization using the method of deciding the focal plane can be used when crystallizing a silicon thin film using a general laser.

An excimer laser annealing method using a pulse-type laser is mainly used for the laser crystallization. Recently, a Sequential Lateral Solidification (SLS) method, which remarkably improves crystallization characteristics by growing grains in a horizontal direction, has been proposed and studied widely.

The sequential lateral solidification takes advantage of the fact that grains grow at right angles to an interface between liquid phase silicon and solid phase silicon in which the silicon grain size can increase by laterally growing grains with a predetermined length by properly controlling the strength of the laser energy and the irradiation range of the laser beam.

Such sequential lateral solidification method will be described in detail with reference to the accompanying drawings.

Figure 2A:
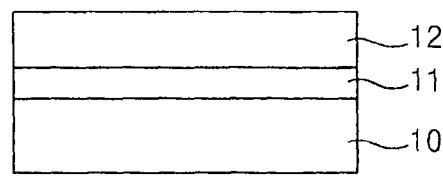
FIGS. 2A to 4C are sectional views illustrating silicon crystallization mechanisms according to the laser energy densities of the graph shown in FIG. 1.
Figure 2B:
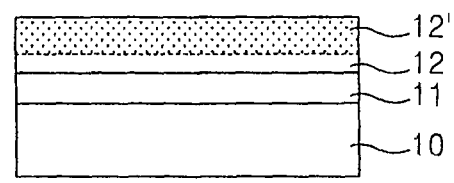
Figure 2C:
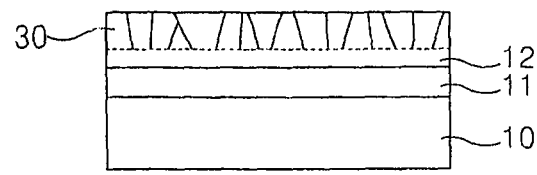
Figure 3A:
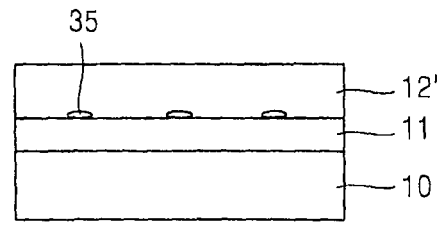
Figure 3B:
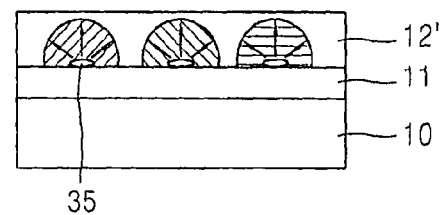
Figure 3C:
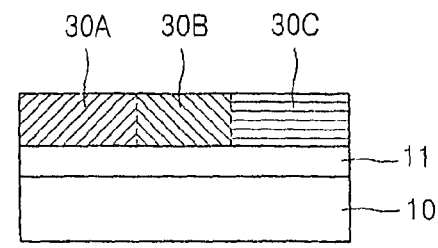
Figure 4A:
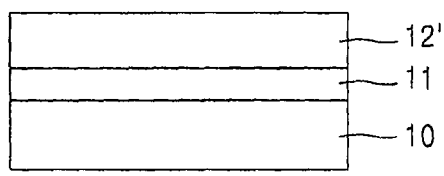
Figure 4B:
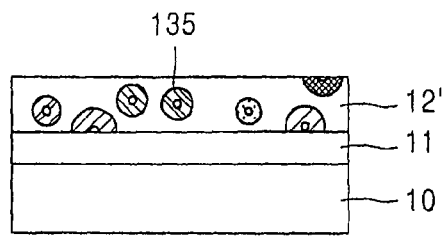
Figure 4C:
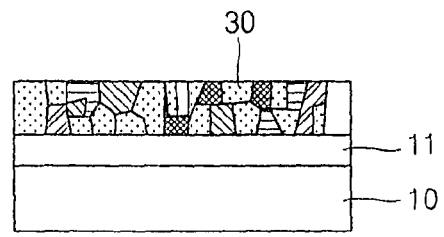
Figure 5:
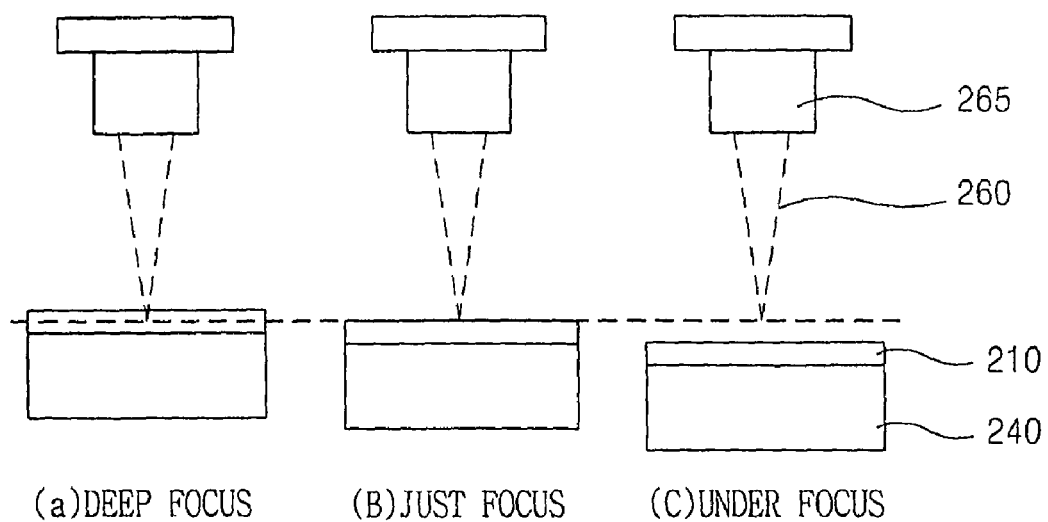
FIG. 5 is an exemplary view illustrating a variety of focal planes of a laser beam.
Figure 6A:
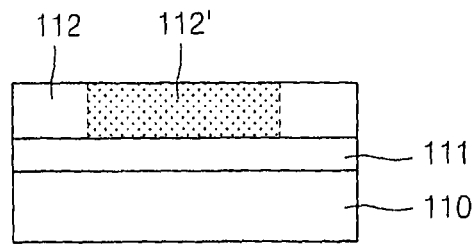
FIGS. 6A to 6C are sectional views illustrating a sequential crystallization process according to lateral solidification according to the present invention.
Figure 6B:
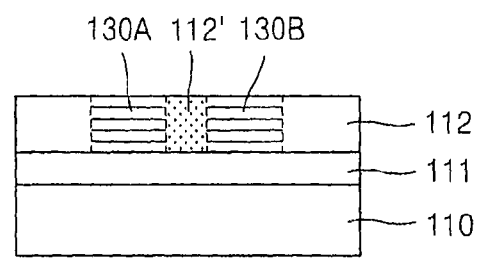
Figure 6C:
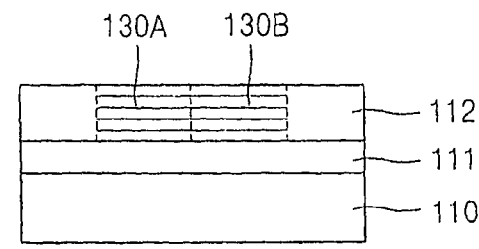

FIGS. 6A to 6C are sectional views illustrating a sequential crystallization process according to lateral solidification in which the present invention applies.

First, as shown in FIG. 6A, when a laser having an energy density higher than the energy density where an amorphous silicon thin film 112 melts completely (e.g., the laser energy density in the third region (III) of FIG. 1) is irradiated, a portion (112') of the amorphous silicon thin film 112, which has received the laser, completely melts. The silicon thin film 112 is formed on a substrate 110 with a buffer layer 111 therebetween.

At this time, a patterned mask, which is ready in advance, divides an irradiated region where the laser is irradiated and a non-irradiated region where the laser is not irradiated.

At this time, as shown in FIGS. 6B and 6C, since the laser having sufficient energy is irradiated onto the amorphous silicon thin film 112, the amorphous silicon thin film 112 can be completely melted. However, because the beam having certain intervals is used to melt the amorphous silicon thin film, crystals grow by making solid phase silicon, which exists at the interface between the silicon thin film 112 of the non-irradiated region and the melted silicon thin film 112', nuclei.

In other words, immediately after the laser energy is irradiated, the melted silicon thin film 112' cools through the left and right surfaces, that is, through the non-irradiated region where the laser beam has not been irradiated. This is because the left and right surfaces of the solid phase silicon thin film 112 have higher heat conductivity than the buffer layer 111 or the glass substrate 110 below the silicon thin film 112 and 112'.

Accordingly, the melted silicon thin film 112' first reaches a nucleus formation temperature at an interface between the horizontal solid phase and the liquid phase at the left and right portions, rather than at the center portion, thereby forming a crystal nucleus at the corresponding portion. After the formation of crystal nucleus, horizontal growth of grains 130A and 130B take place from a low temperature side to a high temperature side, that is, from the interface to the center portion.

Because of the side crystal growth, large grains 130A and 130B are completely formed as shown in FIG. 6C. A process window is also large, since the process is performed with the energy of the third region.

Meanwhile, when forming a polycrystalline silicon thin film having such superior crystallization characteristics, it is important for a laser beam to be irradiated on a substrate to have a best-fit focal plane.

Namely, in order to perform the crystallization process employing the above-mentioned sequential lateral solidification method as shown in FIGS. 6A-6C, it is important for a focal plane state of a laser to be irradiated to make a just focus.

Accordingly, the present invention provides a method of deciding a best-fit focal plane and a method of crystallization using the method of deciding the best-fit focal plane.

Hereinafter, the preferred embodiments of a method of deciding a best-fit focal plane and a method of crystallization using the same in accordance with the present invention will be described in detail with reference to the accompanying drawings.

Figure 7:
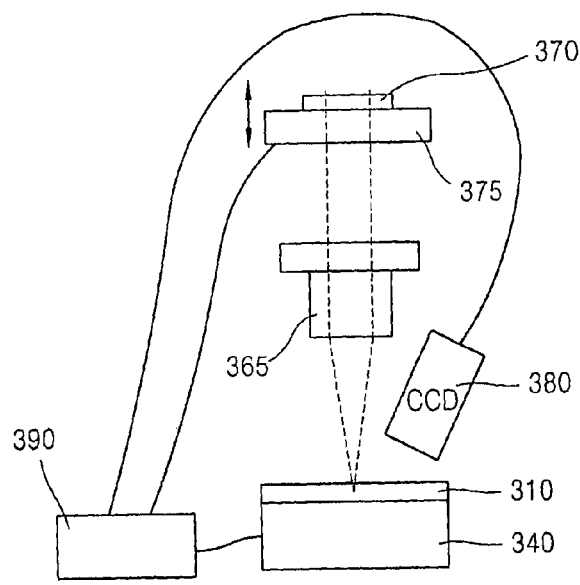
FIG. 7 is an exemplary view schematically illustrating a system in which a method of deciding a focal plane of the present invention can be implemented in accordance with the present invention.

FIG. 7 is an exemplary view schematically illustrating a system in which a method of deciding a focal plane can be implemented in accordance with the present invention.

As shown therein, in order to decide a best-fit focal plane, the system includes a moving stage 340 for moving a substrate 310, laser equipment for irradiating a laser beam on the substrate 310, a laser mask 370 loaded onto a mask stage and forming a test pattern on the substrate 310, an optical lens 365, a CCD (Charge Coupled Device) 380 for recognizing and transmitting a crystallization state of a silicon thin film crystallized on the substrate 310, and a computer 390 for analyzing an image transmitted from the CCD 380 and determining best-fit focal plane conditions. All the components of the system are operatively coupled.

At this time, the optical lens 365 is installed between the laser mask 370 and the substrate 310 and form a focal point of a laser beam on a surface of the substrate 310. Meanwhile, a projection lens for controlling a density of the laser beam at a certain ratio can be used as the optical lens 365.

In addition, a laser beam to be irradiated on the amorphous silicon thin film has the energy density enough to completely melt the amorphous silicon thin film.

Also, separate crystallization equipment is not used as the laser equipment. Laser equipment used for the crystallization process through which an amorphous silicon thin film is crystallized is used in the best-fit focal plane deciding process, and it is different in respect that the test mask 370 for forming a best-fit focal plane is loaded onto the mask stage.

At this time, in order to decide a best-fit focal plane, the present invention utilizes a state change of an amorphous silicon thin film crystallized by a laser beam passing through the test mask 370 having small crystallization slits.

When the laser beam passing through such small slits become exactly just focus, the laser having the most energy is made incident upon the silicon thin film. That is, though a laser beam does not become just focus, an amorphous silicon thin film can be completely melted when using a mask with large slits. At this time, silts vary according to the conditions of the optical system and laser equipment, and it is desired that slits as small as possible are used in the above-mentioned conditions.

Figure 8A:
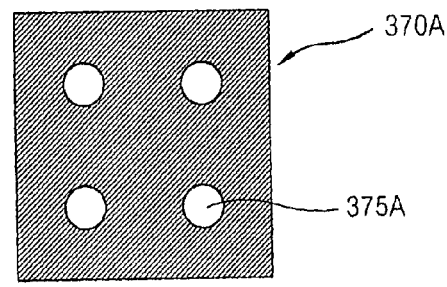
FIGS. 8A and 8B are exemplary views illustrating the test mask of FIG. 7 in accordance with embodiments of the present invention.
Figure 8B:
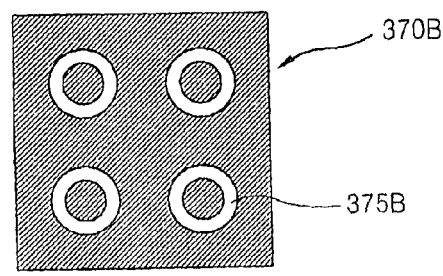

FIGS. 8A and 8B are views illustrating different examples of the test mask 370 in accordance with the present invention.

As shown therein, four slits 375A and 375B each having a small size corresponding to approximately 0.5 to 2 μm are respectively formed on test masks 370A and 370B for searching for a best-fit focal plane.

At this time, a certain number of small slits 375A and 375B having certain regions are formed respectively on the test masks 370A and 370B such that an image area in a just focus state can be easily calculated through an image analyzer of the computer 390. The slits 375A and 375B respectively have a round shape and a doughnut shape in the figures to easily calculate the image area. However, all kinds of shapes and sizes including a triangle, a square, and other polygons are allowable for such slits, and there is no limit to the number of slits in a test mask.

At this time, when a laser beam passing though such small silts 375 and 375B becomes exactly just focus, this means that the laser having the most energy is currently being made incident upon a silicon thin film and thus completely melts the thin film by the largest area.

Figure 9:
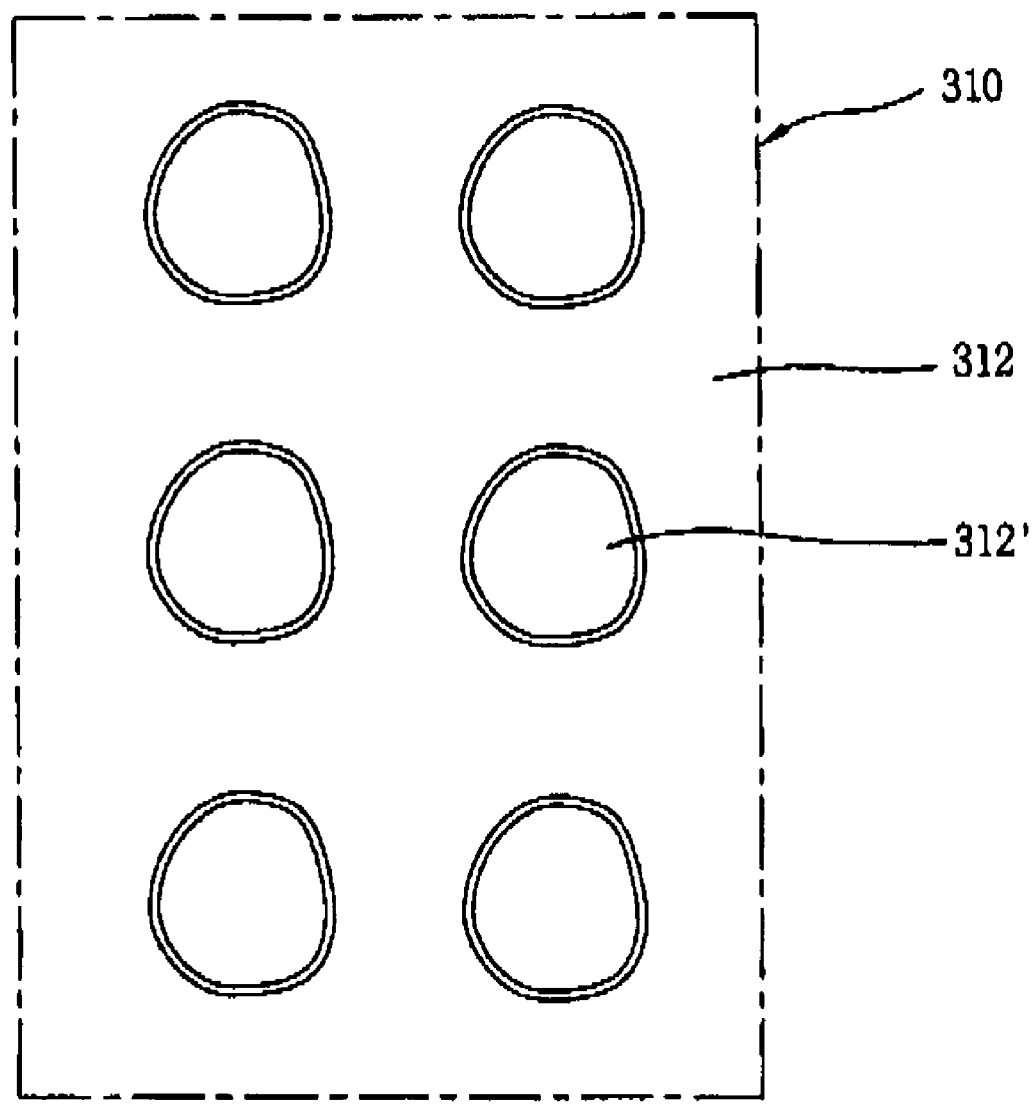
FIG. 9 shows a picture illustrating a silicon thin film crystallized using the test mask shown in FIG. 8A, observed under the SEM.

As for the crystallization shape of the amorphous silicon thin film crystallized by the laser beam having passed through such a test mask 370A, as shown in FIG. 9 a round crystalline silicon thin film 312' according to the slit 375A pattern is formed in an amorphous silicon thin film 312 on a substrate 310.

The silicon thin film 312' crystallized by the laser irradiation has a brighter round shape than that of the amorphous silicon thin film 312 of a non-irradiated region.

At this time, FIG. 9 shows a picture observed under the Scanning Electron Microscope (SEM), as an example, which illustrates how a silicon thin film is crystallized by the laser beam having passed through slits of 1.4×1.4 μm, using the test mask shown in FIG. 8A.

Meanwhile, when the laser beam having passed though the small slits becomes just focus, the largest region completely melts. This is recognized by the CCD camera 380 and is analyzed by the computer 390 searching for best-fit focal plane conditions.

Figure 10:
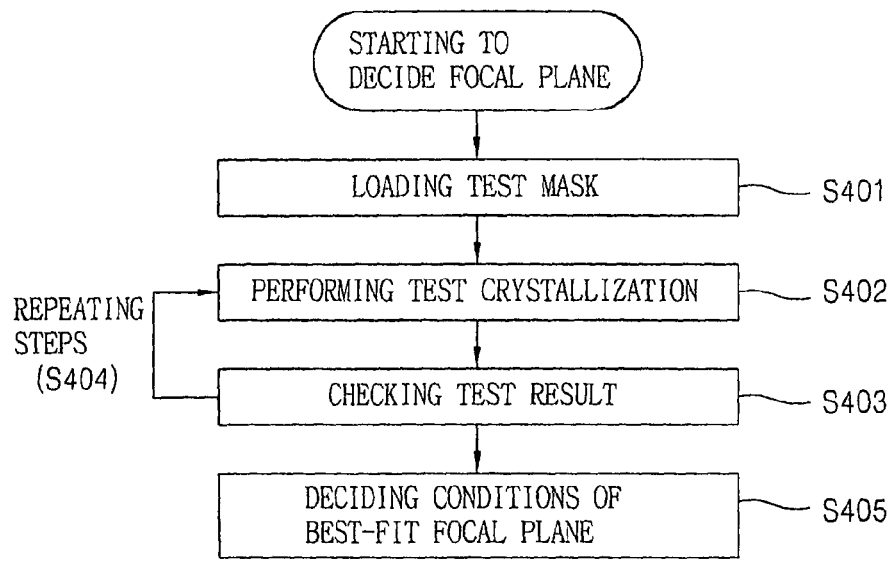
FIG. 10 is a flow chart illustrating a method of deciding a focal plane in accordance with an embodiment of the present invention.

A method of deciding a focal plane of the present invention by the system having such construction as in FIGS. 7-8B will be described in detail with reference to FIG. 10.

Firstly, in order to decide a best-fit focal plane, a test substrate on which silicon is deposited is loaded onto a moving stage. The moving stage is installed at laser equipment for crystallization process as shown in, e.g., FIG. 7. A process of deciding a focal plane in accordance with the present invention is performed using the same equipment for crystallization process, before the actual crystallization process for a desired layer starts.

Thereafter, the test mask 370 for a test is loaded onto the mask stage of the laser equipment using the sliding method or other suitable methods (S410). A plurality of slits having a very small size can be formed on the test mask in order to search for the best-fit focal plane as described above, e.g., in FIG. 8A or FIG. 8B.

At this time, a certain number of small slits having certain regions are formed such that an image area in a just focus state can be easily calculated through an image analyzer of the computer 390.

Next, a crystallization test begins by irradiating a laser beam (e.g., using a one pulse type laser) onto the test substrate through the small slits of the test mask (S402). At this time, the laser equipment and optical system are set on conditions identical to the crystallization process, thereby performing the crystallization test.

Thereafter, the result of one pulse-type laser test is recognized through the CCD 380 (S403).

Such a test is repeatedly carried out by moving the test mask 370 upwardly and downwardly by moving the mask stage upwardly and downwardly at a predictable focal plane region, and the CCD 380 captures the test results as images (S402 to S404).

Each test result image is transmitted to the computer 390 having a function to analyze the image from the CCD 379 and is analyzed by the computer 390, thereby deciding a best-fit focal plane for the laser beam. Here, the image analyzing function of the computer 390 can be implemented as computer programs(s) embodied on one or more computer-readable media. According to this, the mask stage is moved upwardly and downwardly, deciding the best-fit focal plane (S405).

More specifically, the computer 390 analyzes the transmitted crystallization test results and decides the best-fit focal plane. The best-fit focal plane for the laser beam is determined to be one that results in an area of the crystallized region to be the largest, which can be determined through the image analysis. Once the best-fit focal plane for the laser beam is decided, it is used in crystallizing silicon or other types of thin films.

Figure 11:
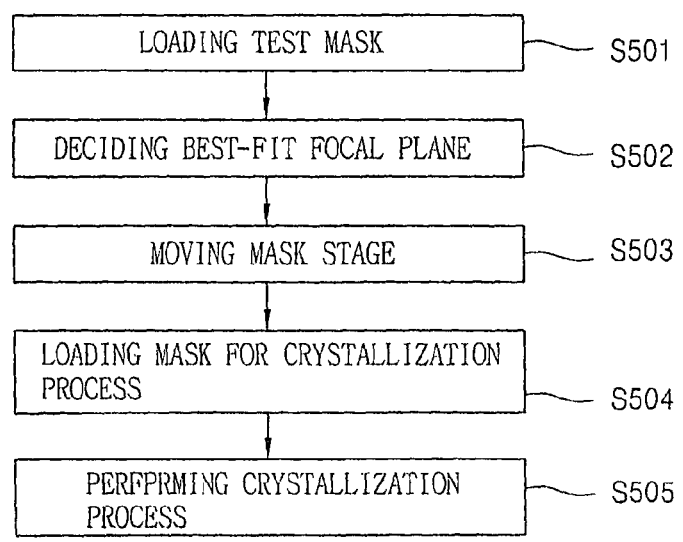
FIG. 11 is a flow chart illustrating a crystallization method of an amorphous silicon thin film employing the method of deciding the focal plane in accordance with an embodiment of the present invention.

The processes for crystallizing a silicon thin film using the decided best-fit focal plane will now be described in more detail with reference to FIG. 11 according to the present invention.

After the test mask 370 is loaded onto the laser mask stage, a best-fit focal plane is decided by performing the above-mentioned method (FIG. 10) of deciding a focal plane (S501 and S502).

Thereafter, according to the conditions of the decided best-fit focal plane, the mask stage is moved to the best-fit position (S503).

Next, crystallization processes begin by sliding a mask for crystallization process onto the mask stage and irradiating a laser beam (S504 and S505). This results in optimum crystallization conditions for any layer to be crystallized.

As so far described, the method of deciding a focal plane in accordance with the present invention is capable of obtaining a silicon thin film having improved crystallization characteristics and simultaneously reducing the crystallization time and the cost by deciding a best-fit focal lane using the test mask and then performing the crystallization.

In addition, by making the equipment such as a computer automatically decide a best-fit focal plane, a focal plane can be easily and quickly decided.

An one example of application, the present crystallization system and method can be used in fabricating display devices such as LCDs of various applications. But the invention is not limited to such, and can be applied to other suitable areas requiring crystallization of a layer or film.

It will be apparent to those skilled in the art that various modifications and variations can be made in the above-discussed systems and methods without departing from the spirit or scope of the invention. Thus, it is intended that the present invention cover the modifications and variations of this invention provided they come within the scope of the appended claims and their equivalents.

What is claimed is:

1. A system for crystallization, comprising:
a test mask having slits;
an optical device impinging a laser beam on a test layer through the test mask, so as to produce a crystallization test image;
an image device capturing the crystallization test image; and
an analyzer analyzing the captured crystallization test image by calculating an area which a crystallized region occupies from an entire area of the test layer and determining a best-fit focal plane of the laser beam for performing a crystallization process by determining conditions in which an area of the crystallized region of the test layer is the largest.

2. The system of claim 1, further comprising:
a movable mask stage on which the test mask can be placed to produce a plurality of crystallization test images as the mask stage is moved.

3. The system of claim 2, further comprising:
a crystallization mask disposable on the mask stage at a position corresponding to the determined best-fit focal plane,
wherein the optical device impinges the laser beam on a layer to be crystallized through the crystallization mask disposed at the position corresponding to the determined best-fit focal plane.

* * * * *